US008659518B2

(12) United States Patent
Nathan et al.

(10) Patent No.: US 8,659,518 B2
(45) Date of Patent: *Feb. 25, 2014

(54) VOLTAGE PROGRAMMED PIXEL CIRCUIT, DISPLAY SYSTEM AND DRIVING METHOD THEREOF

(71) Applicant: Ignis Innovation Inc., Waterloo (CA)

(72) Inventors: Arokia Nathan, Cambridge (GB); Gholamreza Chaji, Waterloo (CA); Peyman Servati, Vancouver (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/934,652

(22) Filed: Jul. 3, 2013

(65) Prior Publication Data

US 2013/0293522 A1  Nov. 7, 2013

Related U.S. Application Data

(63) Continuation of application No. 13/211,732, filed on Aug. 17, 2011, now Pat. No. 8,497,825, which is a continuation of application No. 11/341,332, filed on Jan. 27, 2006, now Pat. No. 8,044,893.

(30) Foreign Application Priority Data

Jan. 28, 2005  (CA) ..................................... 2495726

(51) Int. Cl.
*G09G 3/30* (2006.01)
(52) U.S. Cl.
USPC ............... 345/76; 345/82; 345/204; 345/214; 313/463; 315/169.3
(58) Field of Classification Search
USPC ................... 345/76–82, 204, 214; 315/169.3; 313/463
See application file for complete search history.

(56) References Cited

U.S. PATENT DOCUMENTS

| 4,354,162 A | 10/1982 | Wright |
| 4,758,831 A | 7/1988 | Kasahara et al. |
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |
| 5,498,880 A | 3/1996 | Lee et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,686,935 A | 11/1997 | Weisbrod |

(Continued)

FOREIGN PATENT DOCUMENTS

| CA | 1294034 | 1/1992 |
| CA | 2109951 | 11/1992 |

(Continued)

OTHER PUBLICATIONS

Ahnood et al.: "Effect of threshold voltage instability on field effect mobility in thin film transistors deduced from constant current measurements"; dated Aug. 2009 (3 pages).

(Continued)

*Primary Examiner* — Lun-Yi Lao
*Assistant Examiner* — Shaheda Abdin
(74) *Attorney, Agent, or Firm* — Nixon Peabody LLP

(57) ABSTRACT

A voltage programmed pixel circuit, display system having the pixel circuit and driving method thereof is provided. The pixel circuit includes a light emitting device, a driving transistor connected to the light emitting device and a programming circuit. The programming circuit adjusts a pixel current during a programming cycle of the pixel circuit.

12 Claims, 13 Drawing Sheets

(56) References Cited

U.S. PATENT DOCUMENTS

| | | |
|---|---|---|
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,091,203 A | 7/2000 | Kawashima et al. |
| 6,097,360 A | 8/2000 | Holloman |
| 6,144,222 A | 11/2000 | Ho |
| 6,177,915 B1 | 1/2001 | Beeteson et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagishi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,580,408 B1 | 6/2003 | Bae et al. |
| 6,580,657 B2 | 6/2003 | Sanford et al. |
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B1 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lin et al. |
| 6,806,857 B2 | 10/2004 | Sempel et al. |
| 6,809,706 B2 | 10/2004 | Shimoda |
| 6,859,193 B1 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,493,295 B2 | 7/2013 | Yamazaki et al. |
| 8,497,525 B2 | 7/2013 | Yamagata et al. |
| 2001/0002703 A1 | 6/2001 | Koyama |

(56) References Cited

U.S. PATENT DOCUMENTS

| | | |
|---|---|---|
| 2001/0004190 A1 | 6/2001 | Nishi et al. |
| 2001/0020926 A1 | 9/2001 | Kuijk |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kujik |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0179626 A1 | 9/2003 | Sanford et al. |
| 2003/0197663 A1 | 10/2003 | Lee et al. |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2009/0160743 A1 | 6/2009 | Tomida et al. |
| 2009/0213046 A1 | 8/2009 | Nam |
| 2010/0079711 A1 | 4/2010 | Tanaka |
| 2010/0328294 A1 | 12/2010 | Sasaki et al. |
| 2011/0090210 A1 | 4/2011 | Sasaki et al. |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |

(56) References Cited

FOREIGN PATENT DOCUMENTS

| | | |
|---|---|---|
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| CN | 1139907 C | 2/2004 |
| CN | 1534568 | 10/2004 |
| CN | 1551059 | 12/2004 |
| DE | 20 2006 00542 | 6/2006 |
| EP | 0 940 796 | 9/1999 |
| EP | 1 028 471 A | 8/2000 |
| EP | 1 096 466 | 5/2001 |
| EP | 1 103 947 | 5/2001 |
| EP | 1 130 565 A1 | 9/2001 |
| EP | 1 184 833 | 3/2002 |
| EP | 1 194 013 | 3/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-089198 | 3/2000 |
| JP | 2000-352941 | 12/2000 |
| JP | 2001-147659 | 5/2001 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003177709 | 6/2003 |
| JP | 2003-271095 | 9/2003 |
| JP | 2003/308046 | 10/2003 |
| JP | 2004-341444 | 12/2004 |
| JP | 2005-057217 | 6/2005 |
| TW | 473623 | 1/2002 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 9948079 | 9/1999 |
| WO | WO 01/06484 | 1/2001 |
| WO | WO 01/27910 A1 | 4/2001 |
| WO | WO 03/063124 | 3/2002 |
| WO | WO 02/067327 A | 8/2002 |
| WO | WO 03/034389 A | 4/2003 |
| WO | WO 03/075256 | 9/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2007/115737 | 10/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).

(56) References Cited

OTHER PUBLICATIONS

Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
Chinoy, "Reactive Ion Etching of Benzocyclobutene Polymer Films", IEEE Transactions on Components, Packaging and Manufacturing Technology-Part C, vol. 20, No. 3, Jul. 1997, pp. 199-206.
Dow, "Cyclotene™ 4000 Series Advanced Electronic Resins (Photo BCB), Processing Procedures for Cyclotene 4000 Series Photo BCB Resins DS2100 Puddle Develop Process", Cyclotene™ Advanced Electronic Resins, Revised: May 3, 1999, pp. 1-8.
Dow, "Cyclotene™ 4000 Series Advanced Electronic Resins (Photo BCB), Processing Procedures for Cyclotene™ 4000 Series Photo BCB Resins Immersion Develop Process", Cyclotene™ Advanced Electronic Resins, Revised: Apr. 2, 2001, pp. 1-9.
European Search Report and Written Opinion for Application No. 08 86 5338 mailed Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report mailed Mar. 26, 2012 in corresponding European Patent Application No. 10000421.7 (6 pages).
Extended European Search Report mailed Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, mailed Apr. 28, 2009.
International Search Report for International Application No. PCT/IB2011/055135, Canadian Patent Office, dated Apr. 16, 2012 (5 pages).
International Search Report mailed Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Machine English translation of JP 2002-333862, 49 pages.
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)", dated 2006 (4 pages).
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan, et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 Dated Jul. 5, 2013; 8 pages.
Patent Abstracts of Japan, vol. 1997, No. 08, Aug. 29, 1997, & JP 09 090405 A, Apr. 4, 1997 Abstract.
Patent Abstracts of Japan, vol. 1999, No. 13, Nov. 30, 1999, & JP 11 231805 A, Aug. 27, 1999 Abstract.
Patent Abstracts of Japan, vol. 2000, No. 09, Oct. 13, 2000—JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Sanford, James L., et al., "4.2 TFT AMOLED Pixel Circuits and Driving Methods", SID 03 Digest, ISSN/0003, 2003, pp. 10-13.
Tatsuya Sasaoka et al., 24.4L; Late-News Paper: A 13.0-inch AM-Oled Display with Top Emitting Structure and Adaptive Current Mode Programmed Pixel Circuit (TAC)', SID 01 Digest, (2001), pp. 384-387.
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion mailed Jul. 30, 2009 for International Application No. PCT/CA2009/000501 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01 Digest, (2001), pp. 380-383.
European Search Report mailed Oct. 29, 2009 which issued in corresponding European Patent Application No. 06705080.7 (8 pages).
International Search Report mailed May 12, 2006 which issued in corresponding International Patent Application No. PCT/CA2006/000096 (2 pages).

VOLTAGE PROGRAMMED PIXEL CIRCUIT, DISPLAY SYSTEM AND DRIVING METHOD THEREOF

CROSS REFERENCE TO RELATED APPLICATIONS

This application is a continuation of U.S. patent application Ser. No. 13/211,732, filed Aug. 17, 2011, now allowed, which is a continuation of U.S. patent application Ser. No. 11/341,332, now U.S. Pat. No. 8,044,893, filed Jan. 27, 2006 which claims priority to Canadian Patent Application No. 2,495,726, filed Jan. 28, 2005; the entire contents of which are incorporated herein by reference.

FIELD OF INVENTION

The present invention relates to a light emitting device display, and more specifically to a driving technique for the light emitting device display.

BACKGROUND OF THE INVENTION

Recently active-matrix organic light-emitting diode (AMOLED) displays with amorphous silicon (a-Si), poly-silicon, organic, or other driving backplane have become more attractive due to advantages over active matrix liquid crystal displays. An AMOLED display using a-Si backplanes, for example, has the advantages that include low temperature fabrication that broadens the use of different substrates and makes flexible displays feasible, and its low cost fabrication that yields high resolution displays with a wide viewing angle.

The AMOLED display includes an array of rows and columns of pixels, each having an organic light-emitting diode (OLED) and backplane electronics arranged in the array of rows and columns. Since the OLED is a current driven device, the pixel circuit of the AMOLED should be capable of providing an accurate and constant drive current.

FIG. 1 shows a pixel circuit as disclosed in U.S. Pat. No. 5,748,160. The pixel circuit of FIG. 1 includes an OLED 10, a driving thin film transistor (TFT) 11, a switch TFT 13, and a storage capacitor 14. The drain terminal of the driving TFT 11 is connected to the OLED 10. The gate terminal of the driving TFT 11 is connected to a column line 12 through the switch TFT 13. The storage capacitor 14, which is connected between the gate terminal of the driving TFT 11 and the ground, is used to maintain the voltage at the gate terminal of the driving TFT 11 when the pixel circuit is disconnected from the column line 12. The current through the OLED 10 strongly depends on the characteristic parameters of the driving TFT 11. Since the characteristic parameters of the driving TFT 11, in particular the threshold voltage under bias stress, vary by time, and such changes may differ from pixel to pixel, the induced image distortion may be unacceptably high.

U.S. Pat. No. 6,229,508 discloses a voltage-programmed pixel circuit which provides, to an OLED, a current independent of the threshold voltage of a driving TFT. In this pixel, the gate-source voltage of the driving TFT is composed of a programming voltage and the threshold voltage of the driving TFT. A drawback of U.S. Pat. No. 6,229,508 is that the pixel circuit requires extra transistors, and is complex, which results in a reduced yield, reduced pixel aperture, and reduced lifetime for the display.

Another method to make a pixel circuit less sensitive to a shift in the threshold voltage of the driving transistor is to use current programmed pixel circuits, such as pixel circuits disclosed in U.S. Pat. No. 6,734,636. In the conventional current programmed pixel circuits, the gate-source voltage of the driving TFT is self-adjusted based on the current that flows through it in the next frame, so that the OLED current is less dependent on the current-voltage characteristics of the driving TFT. A drawback of the current-programmed pixel circuit is that an overhead associated with low programming current levels arises from the column line charging time due to the large line capacitance.

SUMMARY OF THE INVENTION

It is an object of the invention to provide a method and system that obviates or mitigates at least one of the disadvantages of existing systems.

In accordance with an aspect of the present invention, there is provided a pixel circuit including: a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit for locally adjusting a pixel current during the programming cycle of the pixel circuit, the programming circuit having a programming transistor, the programming transistor being connected to the first electrode of the light emitting device and being biased during the programming cycle of the pixel circuit.

In accordance with a further aspect of the present invention, there is provided a display system, including: a display array including a plurality of pixel circuits, a driver system for driving the display array to establish a programming cycle and a driving cycle; and a controller for controlling the driver system, each pixel circuit including a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit for locally adjusting a pixel current during the programming cycle, the programming circuit having a programming transistor, the programming transistor being connected to the first electrode of the light emitting device and being biased during the programming cycle.

In accordance with a further aspect of the present invention, there is provided a method of driving a pixel circuit, the pixel circuit comprising a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit having a programming transistor, the programming transistor being connected to the first electrode of the light emitting device; the method including the steps: at a programming cycle of the pixel circuit, biasing the programming transistor to locally adjust a pixel current; at a driving cycle of the pixel circuit, enabling the programming transistor to be off.

In accordance with a further aspect of the present invention, there is provided a pixel circuit incorporating a short term biasing condition in which a programming TFT is stable.

In accordance with a further aspect of the present invention, there is provided a pixel circuit structure including two distinct parts having one programming part and one driving part, in which the programming part is under stress for a small fraction of frame time and adjusting the pixel current, while the driving part drives an OLED.

This summary of the invention does not necessarily describe all features of the invention. Other aspects and features of the present invention will be readily apparent to those skilled in the art from a review of the following detailed description of preferred embodiments in conjunction with the accompanying drawings.

BRIEF DESCRIPTION OF THE DRAWINGS

These and other features of the invention will become more apparent from the following description in which reference is made to the appended drawings wherein.

DETAILED DESCRIPTION

Embodiments of the present invention are described using a pixel having an organic light emitting diode (OLED) and a driving thin film transistor (TFT). OLED may be a NIP inverted or PIN non-inverted OLED. However, the pixel may include any light emitting device other than OLED, and the pixel may include any driving transistor other than TFT. It is noted that in the description, "pixel circuit" and "pixel" may be used interchangeably.

The embodiments of the present invention provide locally referenced voltage programmed pixel circuits in which a stable biasing condition is used for a part of the pixel circuit (programming part), and a programming circuit is used to adjust the pixel current during the programming cycle of the pixel circuit locally.

The embodiments of the present invention provide a technique for driving a voltage programmed pixel to provide a stable current source to the OLED. The embodiments of the present invention provide a technique for driving a column/row of voltage programmed pixels to provide stable light emitting device display operation.

Figure 1:
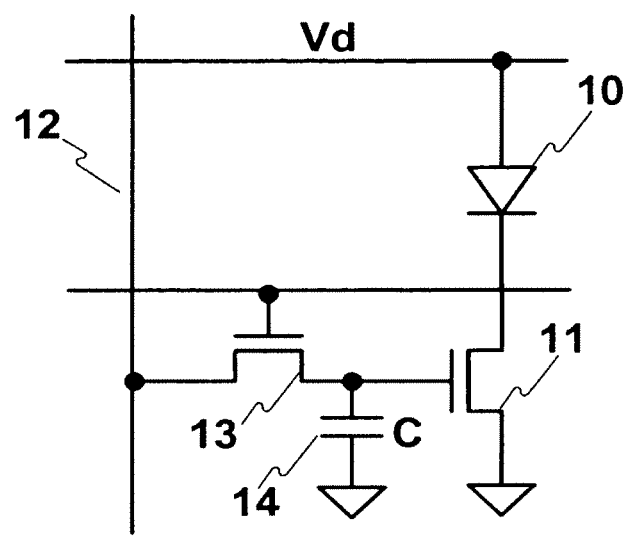
FIG. 1 is a diagram showing a conventional 2-TFT voltage programmed pixel circuit.
Figure 2:
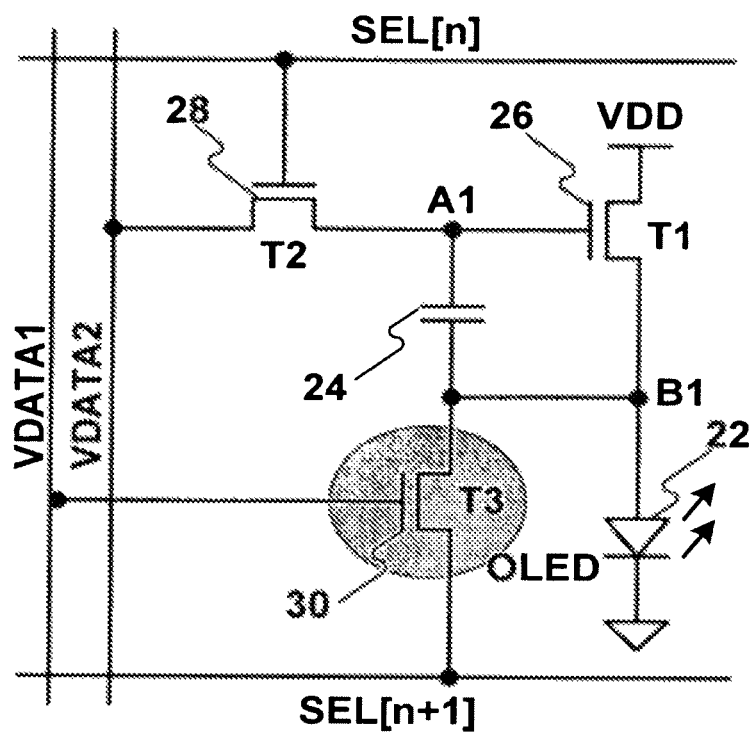
FIG. 2 is a diagram showing a pixel circuit in accordance with an embodiment of the present invention.

FIG. 2 illustrates a locally referenced voltage programmed pixel circuit 20 in accordance with an embodiment of the present invention. The pixel circuit 20 includes an OLED 22, a storage capacitor 24, a driving transistor 26, a switch transistor 28, and a programming circuit having a programming transistor 30. A select line SEL[n] is connected to the switch transistor 28. A signal line VDATA1 is connected to the programming transistor 30. A signal line VDATA2 is connected to the switch transistor 28. A negative voltage line SEL[n+1] is connected to the programming transistor 30. A positive voltage line VDD is connected to the driving transistor 26.

The transistors 26, 28 and 30 are n-type TFTs. However, the transistors 26, 28 and 30 may be p-type transistors. The driving technique applied to the pixel circuit 20 is also applicable to a complementary pixel circuit having p-type transistors. The transistors 26, 28 and 30 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 20 may form an AMOLED display.

The gate terminal of the driving transistor 26 is connected to VDATA2 through the switch transistor 28. The drain terminal of the driving transistor 26 is connected to VDD. The source terminal of the driving transistor 26 is connected to the anode electrode of the OLED 22 (at node B1). The cathode electrode of the OLED 22 is connected to a common ground.

The gate terminal of the switch transistor 28 is connected to SEL[n]. The drain terminal of the switch transistor 28 is connected to VDATA2. The source terminal of the switch transistor 28 is connected to the gate terminal of the driving transistor 26 (at node A1).

The gate terminal of the programming transistor 30 is connected to VDATA1. The drain terminal of the programming transistor 30 is connected to the anode terminal of the OLED 22 (at node B1). The source terminal of the programming transistor 30 is connected to SEL[n+1].

One terminal of the storage capacitor 24 is connected to the gate terminal of the driving transistor 26 and the source terminal of the switch transistor 28 at node A1. The other terminal of the storage capacitor 24 is connected to the source terminal of the driving transistor 26, the drain terminal of the programming transistor 30 and the anode electrode of the OLED 22 at node B1.

The programming transistor 30 is a stable local reference transistor due to its biasing condition, and is used to adjust the pixel current during the programming cycle of the pixel circuit as a local current source. Thus, the pixel current becomes stable despite the aging effects of the driving transistor 26 and the OLED 22. It is noted that in the description, the terms "programming transistor" and "local reference transistor" may be used interchangeably.

Figure 3:
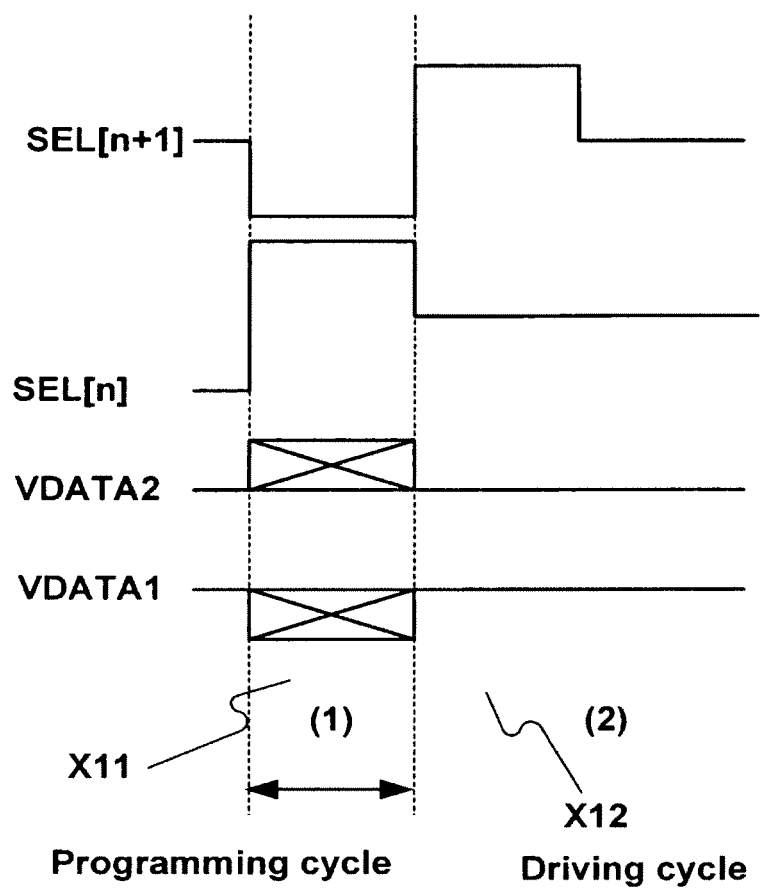
FIG. 3 is a timing diagram showing an example of waveforms for driving the pixel circuit of FIG. 2.

FIG. 3 illustrates a timing diagram showing an example of waveforms applied to the pixel circuit 20 of FIG. 2. Referring to FIGS. 2 and 3, the operation of the pixel circuit 20 includes a programming cycle X11 and a driving cycle X12.

SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X12 of nth row which is the first programming cycle X11 of (n+1)th row as well, SEL[n+1] goes to a high voltage to address (n+1)th row.

The first operating cycle X11: SEL[n] is high and SEL[n+1] has a negative voltage VSS. VDATA2 goes to a bias voltage VB, and VDATA1 has the programming voltage Vp+VSS.

In X11, voltage at node A1 is VB. Thus, voltage at node B1 can be written as $$VB1 = V_B - \left(\frac{(W/L)_{T3}}{(W/L)_{T1}}\right)^{1/2} V_P - \Delta V_T \quad (1)$$

$$\Delta V_T = ((W/L)_{T3}/(W/L)_{T1})^{1/2} V_{T3} - V_{T1} \quad (2)$$

$$V_P = VDATA1 - VSEL[n+1] \quad (3)$$

where VB1 represents the voltage of node B1, $V_{T1}$ represent the threshold voltage of the driving transistor 26, $V_{T3}$ represent the threshold voltage of the programming transistor 30, $(W/L)_{T1}$ is the aspect ratio of the driving transistor 26, and $(W/L)_{T3}$ is the aspect ration of the programming transistor 30.

The second operating cycle X12: SEL[n] is low, and SEL[n+1] is high because of the next row programming cycle. During the driving cycle X12, the voltage of SEL[n+1] is changed. That is due to the programming cycle of a next row as described below, and it does not affect the programming of current row.

In X12, voltage at node B1 goes to $V_{OLED}$, and voltage at node A1 goes to $$VA1 = \left(\frac{(W/L)_{T3}}{(W/L)_{T1}}\right)^{1/2} V_P + \Delta V_T + V_{OLED} \quad (4)$$

wherein $V_{OLED}$ represents voltage at the OLED 22.

The gate-source voltage VGS of the driving transistor 26 is given by:

$$VGS=((W/L)_{T3}/(W/L)_{T1})^{1/2}V_P+\Delta V_T \quad (5)$$

In this embodiment, the programming transistor 30 is positively biased only during the first operating cycle X11, and is not positively biased during the rest of the frame time. Since the programming transistor 30 is on for just small fraction of time, the shift of the threshold voltage $V_{T3}$ is negligible. Therefore, the current of the driving transistor 26 during the operating cycle X21 is independent of the shifts in its threshold voltage and OLED characteristics.

Figure 4:
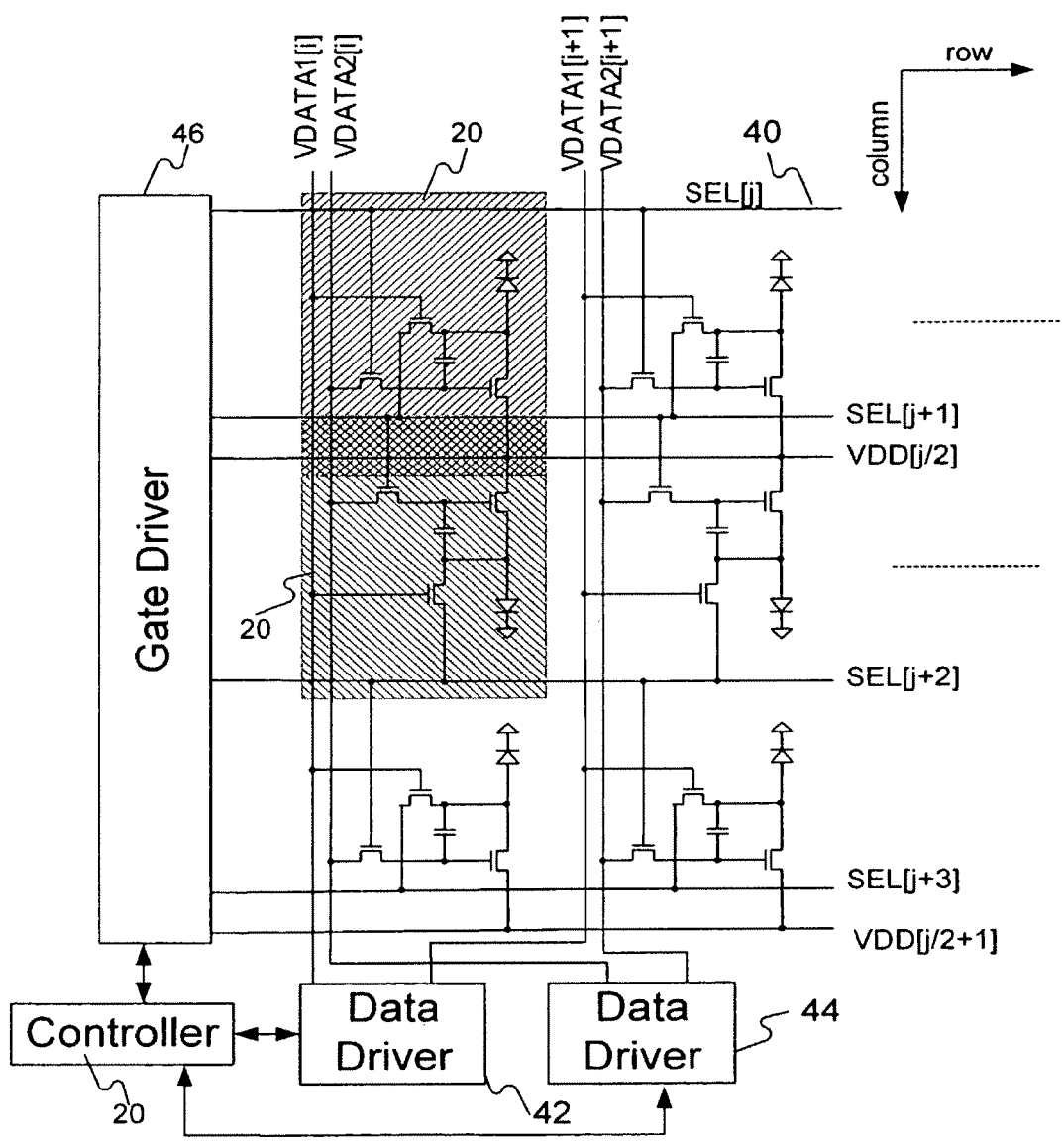
FIG. 4 is a diagram showing a display system having the pixel circuit of FIG. 2.

FIG. 4 illustrates a display system having the pixel circuit 20 of FIG. 2. VDD[j/2] and VDD[j/2+1] of FIG. 4 correspond to VDD of FIG. 2. VDATA1[j] and VDATA1[j+1] of FIG. 4 correspond to VDATA1 of FIG. 2. VDATA2[j] and VDATA2 [j+1] of FIG. 4 correspond to VDATA2 of FIG. 2. SEL[ ], SEL[j+1], SEL[j+2], SEL[j+3] of FIG. 4 corresponds to SEL [n] or SEL[n+1] of FIG. 2.

In FIG. 4, six pixel circuits are shown as examples. The display system of FIG. 4 may include more than six pixel circuits In FIG. 4, two VDATA1 lines, two VDATA2 lines, two VDD lines and four SEL lines are shown as examples. The display system of FIG. 4 may include more than two VDATA1 lines, more than two VDATA2 lines, more than two VDD lines and more than four SEL lines.

The display array 40 of FIG. 4 is an AMOLED display having a plurality of the pixel circuits 20 of FIG. 2. In the array 40, the pixel circuits 20 are arranged in rows and columns VDATA1[i] and VDATA1[i+1] are shared between the common column pixels in the display array 40. VDATA2[i] and VDATA2[i+1] are shared between the common column pixels in the display array 40. SEL[j], SEL[j+1], SEL[j+2] and SEL[j+3] are shared between common row pixels in the display array 40. VDD[j/2] and VDD[j/2+1] are shared between common row pixels in the display array 40. In order to save the area and increase the aperture ratio, VDD [j/2] (VDD[j/2+1]) is shared between two consecutive rows.

A driver 42 is provided for driving VDATA1[j], VDATA1 [j+1] while a driver 44 is provided for driving VDATA2[j], VDATA2[ ]+1]. One of the drivers 42 and 44 contains the display data and the other does not. Depending on the line interface requirement, the drivers 42 and 44 may be located on the two sides of the display.

A driver 46 is provided for driving VDD[j/1], VDD[j/2+1] and SEL[j], SEL[j+1], SEL[j+2], SEL[j+3]. However, a driver for VDD[j/1], VDD[j/2+1] may be provided separately from a driver for SEL[j], SEL[j+1], SEL[j+2], SEL[j+3]. A controller 48 controls the drivers 42, 44 and 46 to drive the pixel circuits as described above.

Figure 5:
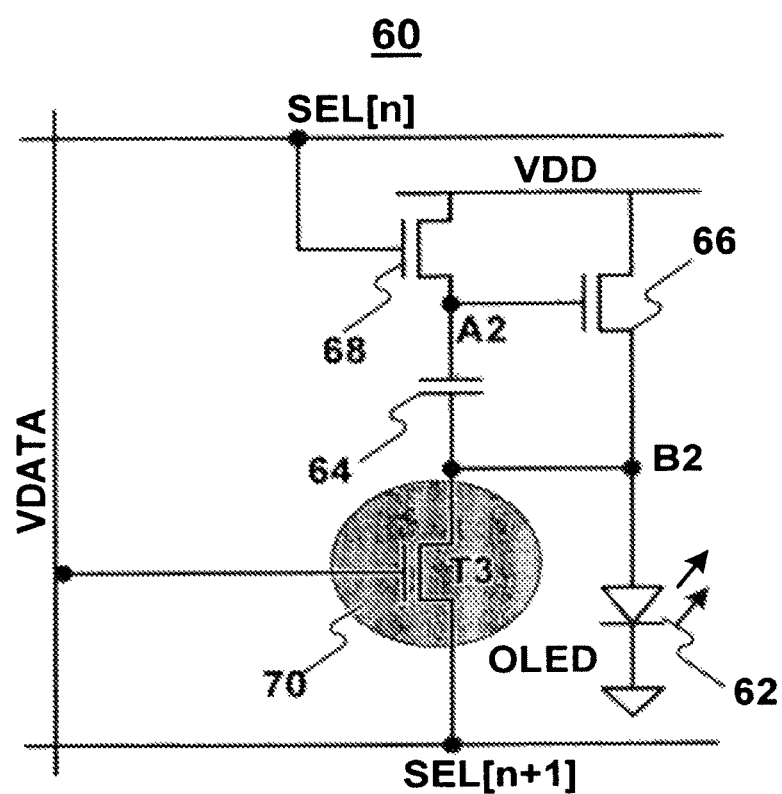
FIG. 5 is a diagram showing a pixel circuit in accordance with a further embodiment of the present invention.

FIG. 5 illustrates a locally referenced voltage programmed pixel circuit 60 in accordance with a further embodiment of the present invention. The pixel circuit 60 includes an OLED 62, a storage capacitor 64, a driving transistor 66, a switch transistor 68 and a programming circuit having a programming transistor 70. A select line SEL[n] is connected to the switch transistor 68. A signal line VDATA is connected to the programming transistor 70. A negative voltage line SEL[n+1] is connected to the programming transistor 70. A positive voltage line VDD is connected to the driving transistor 66 and the switch transistor 68. The voltage in VDD is controllable.

The transistors 66, 68 and 70 are n-type TFTs. However, the transistors 66, 68 and 70 may be p-type transistors. The driving technique applied to the pixel circuit 60 is also applicable to a complementary pixel circuit having p-type transistors. The transistors 66, 68 and 70 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 60 may form an AMOLED display.

The gate terminal of the driving transistor 66 is connected to VDD through the switch transistor 68. The drain terminal of the driving transistor 66 is connected to VDD. The source terminal of the driving transistor 66 is connected to the anode electrode of the OLED 62 (at node B2). The cathode electrode of the OLED 62 is connected to a common ground.

The gate terminal of the switch transistor 68 is connected to SEL[n]. The drain terminal of the switch transistor 68 is connected to VDD. The source terminal of the switch transistor 68 is connected to the gate terminal of the driving transistor 66 (at node A2).

The gate terminal of the programming transistor 70 is connected to VDATA. The drain terminal of the programming transistor 70 is connected to the anode terminal of the OLED 62 (at node B2). The source terminal of the programming transistor 70 is connected to SEL[n+1].

One terminal of the storage capacitor 64 is connected to the gate terminal of the driving transistor 66 and the source terminal of the switch transistor 68 at node A2. The other terminal of the storage capacitor 63 is connected to the source terminal of the driving transistor 66, the drain terminal of the programming transistor 70 and the anode electrode of the OLED 62 at node B2.

The programming transistor 70 is a stable local reference transistor due to its biasing condition and is used to adjust the pixel current during the programming cycle. Thus, the pixel current becomes stable despite the aging effects of the driving transistor 66 and the OLED 62.

Figure 6:
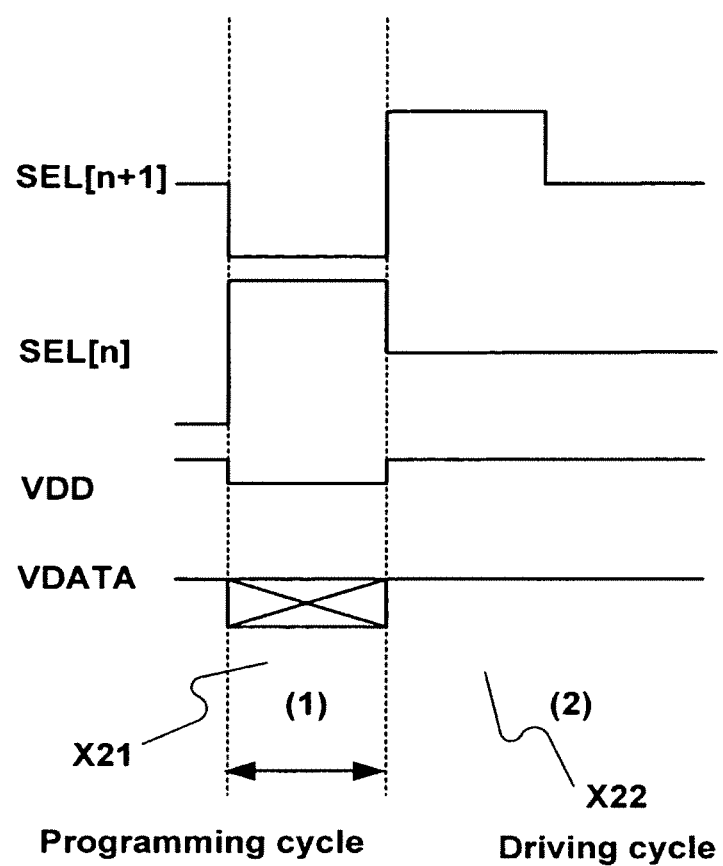
FIG. 6 is a timing diagram showing an example of waveforms for driving the pixel circuit of FIG. 5.

FIG. 6 illustrates a timing diagram showing an example of waveforms applied to the pixel circuit 60 of FIG. 5. Referring to FIGS. 5 and 6, the operation of the pixel circuit 60 includes a programming cycle X21 and a driving cycle X22.

As descried above, SEL[n+1] is shared between nth and (n+1)th rows, and plays two different roles during the programming cycle of nth and (n+1)th row. During the programming cycle of nth row, SEL[n+1] is used to provide the VSS signal. During the programming cycle of the (n+1)th row, SEL[n+1] is used to provide the address signal of (n+1)th row. Therefore, at the second programming cycle X22 of nth row which is the first programming cycle X21 of (n+1)th row as well, SEL[n+1] goes to a high voltage to address (n+1)th row.

The first operating cycle X21: SEL[n] is high and SEL[n+1] has a negative voltage VSS. VDATA goes to a programming voltage Vp+VSS, and VDD has a bias voltage $V_B$.

In X21, voltage at node A2 is $V_B$. Thus, voltage at node B2 can be written as $$VB2 = V_B - \left(\frac{(W/L)_{T3}}{(W/L)_{T1}}\right)^{1/2} V_P - \Delta V_T \quad (6)$$

$$\Delta V_T = ((W/L)_{T3}/(W/L)_{T1})^{1/2} V_{T3} - V_{T1} \quad (7)$$

$$V_P = VDATA1 - VSEL[n+1] \quad (8)$$

where VB2 represents the voltage of node B2, $V_{T1}$ represents the threshold voltage of the driving transistor 66, $V_{T3}$ represent the threshold voltage of the programming transistor 70, $(W/L)_{T1}$ is the aspect ratio of the driving transistor 66, and $(W/L)_{T3}$ is the aspect ration of the programming transistor 70.

The second operating cycle X21: SEL[n] is low, and SEL[n+1] is high because of the next row programming cycle. During the driving cycle X22, the voltage of SEL[n+1] is changed. That is due to the programming cycle of a next row as described below, and it does not affect the programming of current row.

In X22, voltage at node B2 goes to VoLED, and the voltage at node A2 goes to:

$$VA2 = \left(\frac{(W/L)_{T3}}{(W/L)_{T1}}\right)^{1/2} V_P + \Delta V_T + V_{OLED} \quad (9)$$

The gate-source voltage VGS of the driving transistor 66 is given by:

$$VGS = ((W/L)_{T3}/(W/L)_{T1})^{1/2} V_P + V_{T1} - V_{T3} \quad (10)$$

In this embodiment, the programming transistor 70 is positively biased only during the first operating cycle X21, and is not positively biased during the rest of the frame time. Since the programming transistor 70 is on for just small fraction of time, the shift of the threshold voltage VT3 is negligible. Therefore, the current of the driving transistor 66 during the operating cycle is independent of the shifts in its threshold voltage and OLED characteristics.

Figure 7:
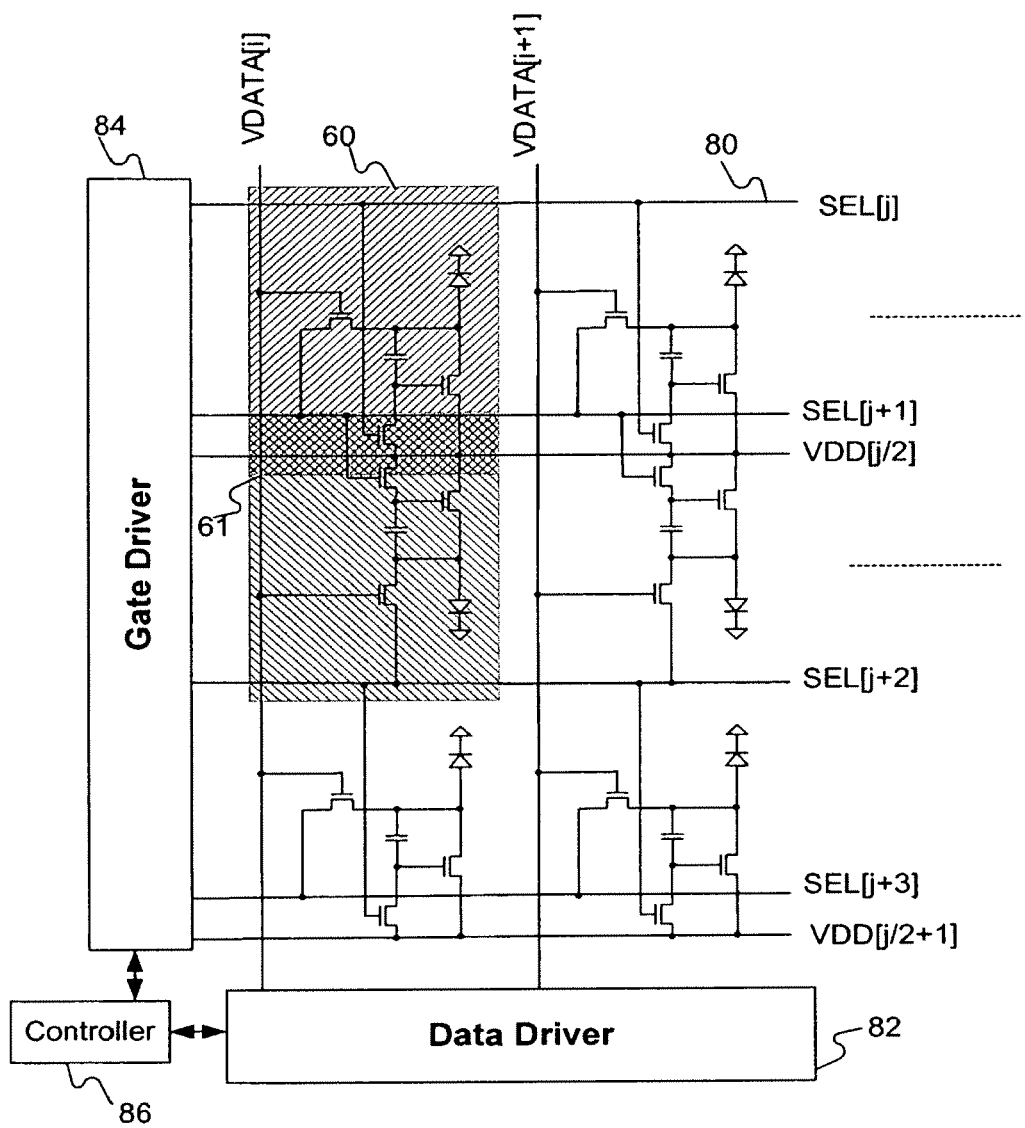
FIG. 7 is a diagram showing a display system having the pixel circuit of FIG. 5.

FIG. 7 illustrates a display system having the pixel circuit 60 of FIG. 5. VDD[j/2] and VDD[j/2+1] of FIG. 7 correspond to VDD of FIG. 5. VDATA1[i] and VDATA1[i+1] of FIG. 7 correspond to VDATA of FIG. 5. SEL[j], SEL[j+1], SEL[j+2], SEL[j+3] of FIG. 7 corresponds to SEL[n] or SEL[n+1] of FIG. 5.

In FIG. 7, six pixel circuits are shown as examples. The display system of FIG. 4 may include more than six pixel circuits In FIG. 7, two VDATA lines, two VDD lines and four SEL lines are shown as examples. The display system of FIG. 7 may include more than two VDATA lines, more than two VDD lines and more than four SEL lines.

The display array 80 of FIG. 7 is an AMOLED display having a plurality of the pixel circuits 60 of FIG. 5. The pixel circuits are arranged in rows and columns VDATA [i] and VDATA [i+1] are shared between the common column pixels in the display array 80. SEL[j], SEL[j+1], SEL[j+2] and SEL [j+3] are shared between common row pixels in the display array 80. VDD[j/2] and VDD [j/2+1] are shared between common row pixels in the display array 80. In order to save the area and increase the aperture ratio, VDD [j/2] (VDD[j/2+1]) is shared between two consecutive rows.

A driver 82 is provided for driving VDATA [j], VDATA [j+1]. A driver 84 is provided for driving VDD[j/1], VDD[j/2+1] and SEL[j], SEL[j+1], SEL[j+2], SEL[j+3]. However, a driver for VDD[j/1], VDD[j/2+1] may be provided separately from a driver for SEL[j], SEL[j+1], SEL[j+2], SEL[j+3]. A controller 86 controls the drivers 82 and 84 to drive the pixel circuits as described above.

Figure 8:
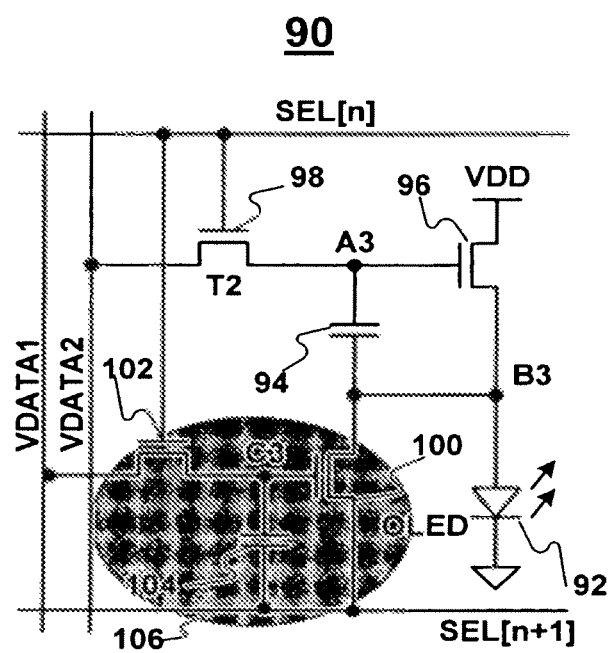
FIG. 8 is a diagram showing a pixel circuit in accordance with a further embodiment of the present invention.

FIG. 8 illustrates a locally referenced voltage programmed pixel circuit 90 in accordance with a further embodiment of the present invention. The pixel circuit 90 includes an OLED 92, a storage capacitor 94, a driving transistor 96, a switch transistor 98, and a programming circuit 106. The programming circuit 106 includes a programming transistor 100, a switch transistor 102 and a storage capacitor 104.

A select line SEL[n] is connected to the switch transistor 98. A signal line VDATA1 is connected to the switch transistor 102. A signal line VDATA2 is connected to the switch transistor 98. A negative voltage line SEL[n+1] is connected to the programming transistor 100. A positive voltage line VDD is connected to the driving transistor 96. The array structure of FIG. 4 can be used for the pixel circuit 90 of FIG. 8.

The transistors 96, 98, 100 and 102 are n-type TFTs. However, the transistors 96, 98, 100 and 102 may be p-type transistors. The driving technique applied to the pixel circuit 90 is also applicable to a complementary pixel circuit having p-type transistors. The transistors 96, 98, 100 and 102 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 90 may form an AMOLED display.

The gate terminal of the driving transistor 96 is connected to VDATA2 through the switch transistor 98. The drain terminal of the driving transistor 96 is connected to VDD. The source terminal of the driving transistor 96 is connected to the anode electrode of the OLED 92 (at node B3). The cathode electrode of the OLED 92 is connected to a common ground.

The gate terminal of the switch transistor 98 is connected to SEL[n]. The drain terminal of the switch transistor 98 is connected to VDATA2. The source terminal of the switch transistor 98 is connected to the gate terminal of the driving transistor 96 (at node A1).

The gate terminal of the programming transistor 100 is connected to VDATA1 through the switch transistor 102. The drain terminal of the programming transistor 100 is connected to the anode terminal of the OLED 92 (at node B3). The source terminal of the programming transistor 100 is connected to SEL[n+1].

The gate terminal of the switch transistor 102 is connected to SEL[n]. The source terminal of the switch transistor 102 is connected to VDATA1. The drain terminal of the switch transistor 102 is connected to the gate terminal of the programming transistor 100 (at node C3).

One terminal of the storage capacitor 94 is connected to the gate terminal of the driving transistor 96 and the source terminal of the switch transistor 98 at node A3. The other terminal of the storage capacitor 94 is connected to the source terminal of the driving transistor 96, the drain terminal of the switch transistor 90 and the anode electrode of the OLED 92 at node B3.

One terminal of the storage capacitor 104 is connected to the gate terminal of the programming transistor 100 and the drain terminal of the switch transistor 102 at node C3. The other terminal of the storage capacitor 104 is connected to SEL[n+1].

The programming circuit 106 is now described in detail. The operation of the pixel circuit 90 includes a programming cycle and a driving cycle. The programming transistor 100 is a stable local reference transistor due to its biasing condition, and is used to adjust the pixel current during the programming cycle. During the programming cycle, a programming voltage is written into the capacitor 104 through the switch transistor 102, and the programming transistor 100 adjusts the pixel current. During the driving cycle, a reset voltage is written into the capacitor 104 and so turns off the programming transistor 100. Therefore, the pixel current flows through the OLED 92. Since the programming transistor 100 is on only during the programming cycle, it does not experience any threshold shift. Thus, the pixel current which is defined by the programming transistor 100 becomes stable.

Figure 9:
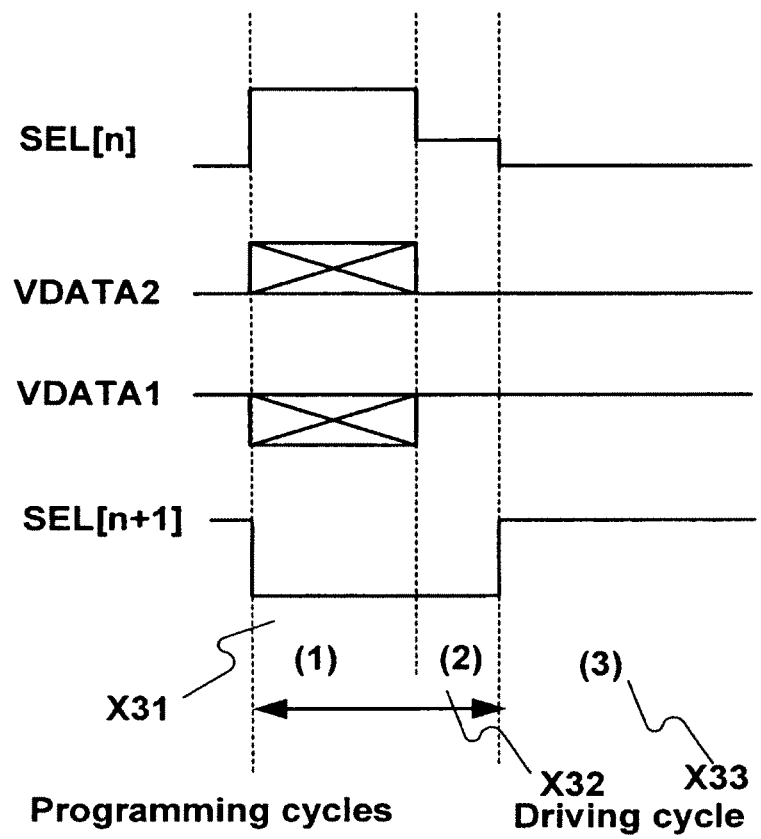
FIG. 9 is a timing diagram showing an example of waveforms for driving the pixel circuit of FIG. 8.

FIG. 9 illustrates a timing diagram showing an example of waveforms applied to the pixel circuit 90 of FIG. 8. Referring to FIGS. 8 and 9, the operation of the pixel circuit 90 includes a programming cycle having operation cycles X31 and X32 and a driving cycle having an operation cycle X33.

As described above, SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X32 of nth row which is the first programming cycle X31 of (n+1)th row as well, SEL[n+1] goes to a high voltage to address (n+1)th row.

The first operating cycle X31: SEL[n] is high and SEL[n+1] has a negative voltage VSS. VDATA1 goes to a programming voltage Vp+VSS, and VDATA2 has a bias voltage $V_B$.

Node C3 is charged to Vp+VSS. Node A3 is charged to the bias voltage $V_B$ As a result, voltage at node B3 goes to:

$$VB3 = V_B - \left(\frac{(W/L)_{T3}}{(W/L)_{T1}}\right)^{1/2} V_P - \Delta V_T \quad (11)$$

$$\Delta V_T = ((W/L)_{T3}/(W/L)_{T1})^{1/2} V_{T3} - V_{T1.} \quad (12)$$

where VB3 represents the voltage of node B3, $V_{T1}$ represent the threshold voltage of the driving transistor 96, and $V_{T3}$ represent the threshold voltage of the programming transistor 100, $(W/L)_{T1}$ is the aspect ratio of driving transistor 96, and $(W/L)_{T3}$ is the aspect ration of the programming transistor 100.

The gate-source voltage of the driving transistor 96 is given by:

$$VGS=((W/L)_{T3}/(W/L)_{T1})^{1/2} VP+V_{T1}-V_{T3} \quad (13)$$

VGS remains at the same value during X32 and X33.

The second operating cycle X32: SEL[n] goes to an intermediate voltage in which the switch transistor 98 is off and the switch transistor 102 is on. VDATA1 goes to zero. Thus the programming transistor 100 turns off.

The third operating cycle X33: SEL[n] is low, and SEL[n+1] is high because of the next row programming cycle as described above.

In X33, node C3 is charged to a reset voltage. Voltage at node B3 goes to WILED which is the corresponding OLED voltage for the give pixel current. Thus, voltage at node A3 goes to $$VA3 = \left(\frac{(W/L)_{T3}}{(W/L)_{T1}}\right)^{1/2} V_P + \Delta V_T + V_{OLED} \quad (14)$$

In this embodiment, the programming transistor 100 is positively biased only during the first operating cycle X31, and is not positively biased during the rest of the frame time. Since the programming transistor 100 is on for just a small fraction of time, its threshold shift is negligible. Therefore, the current of the driving transistor 96 during the operating cycle is independent of the shifts in its threshold voltage and OLED characteristics.

Figure 10:
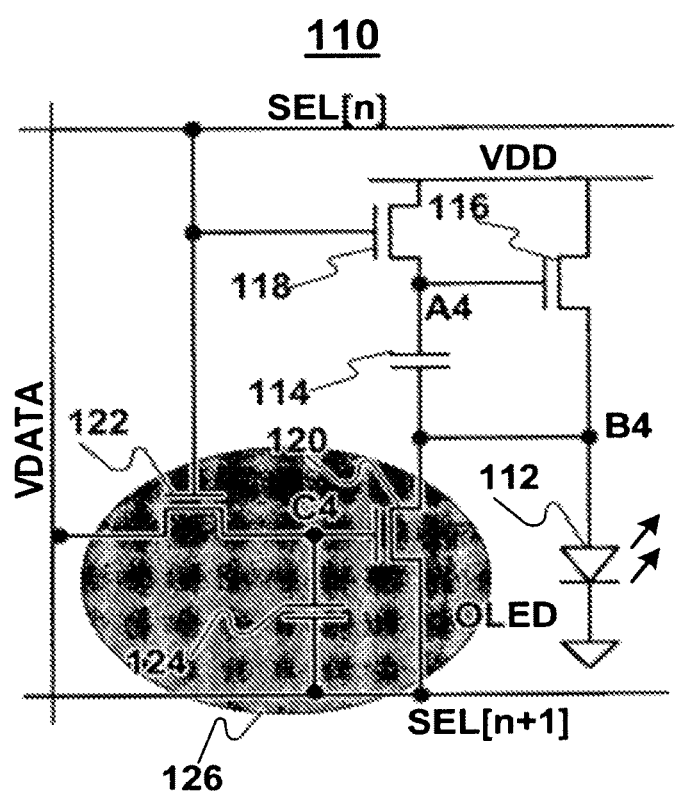
FIG. 10 is a diagram showing a pixel circuit in accordance with a further embodiment of the present invention.

FIG. 10 illustrates a locally referenced voltage programmed pixel circuit 110 in accordance with a further embodiment of the present invention. The pixel circuit 110 includes an OLED 112, a storage capacitor 114, a driving transistor 116, a switch transistor 118, and a programming circuit 126. The programming circuit 126 includes a switch transistor 120, a programming transistor 122 and a storage capacitor 124.

A select line SEL[n] is connected to the switch transistors 118 and 122. A signal line VDATA is connected to the switch transistor 122. A negative voltage line SEL[n+1] is connected to the programming transistor 120. A positive voltage line VDD is connected to the transistors 116 and 118. The voltage of VDD is changeable. The array structure of FIG. 7 can be used for the pixel circuit 110 of FIG. 10.

The transistors 116, 118, 120 and 122 are n-type TFTs. However, the transistors 116, 118, 120 and 122 may be p-type transistors. The programming and driving technique applied to the pixel circuit 110 is also applicable to a complementary pixel circuit having p-type transistors. The transistors 116, 118, 120 and 122 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 110 may form an AMOLED display.

The gate terminal of the driving transistor 116 is connected to VDD through the switch transistor 118. The drain terminal of the driving transistor 116 is connected to VDD. The source terminal of the driving transistor 116 is connected to the anode electrode of the OLED 112 (at node B4). The cathode electrode of the OLED 112 is connected to a common ground.

The gate terminal of the switch transistor 118 is connected to SEL[n]. The drain terminal of the switch transistor 118 is connected to VDD. The source terminal of the switch transistor 118 is connected to the gate terminal of the driving transistor 116 (at node A4).

The gate terminal of the programming transistor 120 is connected to VDATA through the switch transistor 122. The drain terminal of the programming transistor 120 is connected to the anode terminal of the OLED 112 (at node B4). The source terminal of the programming transistor 120 is connected to SEL[n+1].

The gate terminal of the switch transistor 122 is connected to SEL[n]. The source terminal of the switch transistor 122 is connected to VDATA. The drain terminal of the switch transistor 122 is connected to the gate terminal of the programming transistor 120 (at node C4).

One terminal of the storage capacitor 114 is connected to the gate terminal of the driving transistor 116 and the source terminal of the switch transistor 118 at node A4. The other terminal of the storage capacitor 114 is connected to the source terminal of the driving transistor 116, the drain terminal of the programming transistor 120 and the anode electrode of the OLED 112 at node B4.

One terminal of the storage capacitor 124 is connected to the gate terminal of the programming transistor 120 and the drain terminal of the switch transistor 122 at node C4. The other terminal of the storage capacitor 124 is connected to SEL[n+1].

The programming circuit 126 is described in detail. The operation of the pixel circuit 110 includes a programming cycle and a driving cycle. The programming transistor 120 is a stable local reference transistor due to its biasing condition, and is used to adjust the pixel current during the programming cycle. During the programming cycle, a programming voltage is written into the capacitor 124 through the switch transistor 122, and the programming transistor 120 adjusts the pixel current. During the driving cycle, a reset voltage is written into the capacitor 124 and so turns off the programming transistor 120. Therefore, the pixel current flows through the OLED 112. Since the programming transistor 120 is on only during the programming cycle, it does not experience any threshold shift. Thus, the pixel current which is defined by the programming transistor 120 becomes stable.

Figure 11:
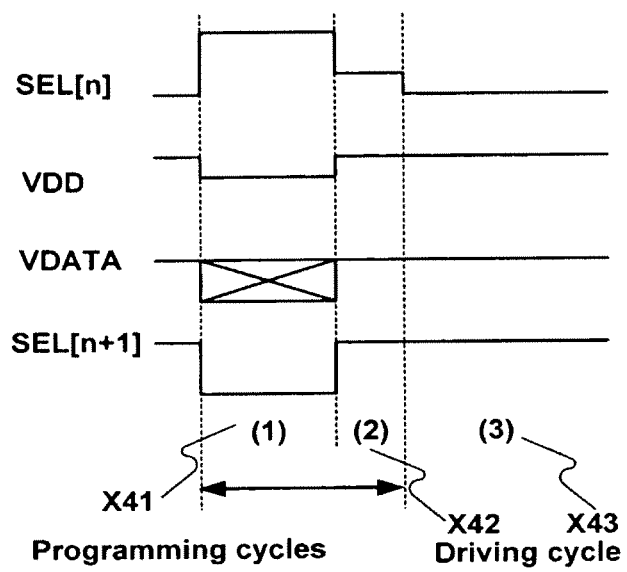
FIG. 11 is a timing diagram showing an example of waveforms for driving the pixel circuit of FIG. 10.

FIG. 11 illustrates a timing diagram showing an example of waveforms applied to the pixel circuit 110 of FIG. 10. Referring to FIGS. 10 and 11, the operation of the pixel circuit 110 includes a programming cycle having operation cycles X41 and X42 and a driving cycle having an operation cycle X43.

As described above, SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X42 of nth row which is the first programming cycle X41 of (n+1)th row as well, SEL[n+1] goes to a high voltage to address (n+1)th row.

The first operating cycle X41: SEL[n] is high and SEL[n+1] has a negative voltage VSS. VDATA goes to a programming voltage Vp+VSS, and VDD has a bias voltage VB.

Node C4 is charged to Vp+VSS. Node A4 is charged to the bias voltage VB. As a result, voltage at node B4 goes to:

$$VB4 = V_B - \left(\frac{(W/L)_{T3}}{(W/L)_{T1}}\right)^{1/2} V_P - \Delta V_T \quad (15)$$

$$\Delta V_T = ((W/L)_{T3}/(W/L)_{T1})^{1/2} V_{T3} - V_{T1} \quad (16)$$

where VB4 represents the voltage of node B4, VT1 represent the threshold voltage of the driving transistor 116, and VT3 represent the threshold voltage of the programming transistor 120, (W/W-ri is the aspect ratio of the driving transistor 116, and (W/L)T3 is the aspect ration of the programming transistor 120.

The gate-source voltage VGS of the driving transistor 116 is given by:

$$VGS = ((W/L)_{T3}/(W/L)_{T1})^{1/2} VP + V_{T1} - V_{T3} \quad (17)$$

VGS remains at the same value during X42 and X43.

The second operating cycle X42: SEL[n] goes to an intermediate voltage in which the switch transistor 118 is off, and the switch transistor 122 is on. VDATA goes to zero. Thus, the programming transistor 120 turns off.

The third operating cycle X43: SEL[n] is low, and SEL[n+1] is high because of the next row programming cycle as described above.

In X43, node C4 is charged to a reset voltage. Voltage at node B4 goes to VOLED which is the corresponding OLED voltage for voltage for the give pixel current. As a result, voltage at node A4 goes to:

$$VA4 = \left(\frac{(W/L)_{T3}}{(W/L)_{T1}}\right)^{1/2} V_P + \Delta V_T + V_{OLED} \quad (18)$$

In this embodiment, the programming transistor 120 is positively biased only during the first operating cycle X41. During the rest of the frame time, the programming transistor 120 is not positively biased. Since the programming transistor 120 is on for just a small fraction of time, its threshold shift is negligible. Therefore, the current of the driving transistor 116 during the operating cycle is independent of the shifts in its threshold voltage and OLED characteristics.

Figure 12:
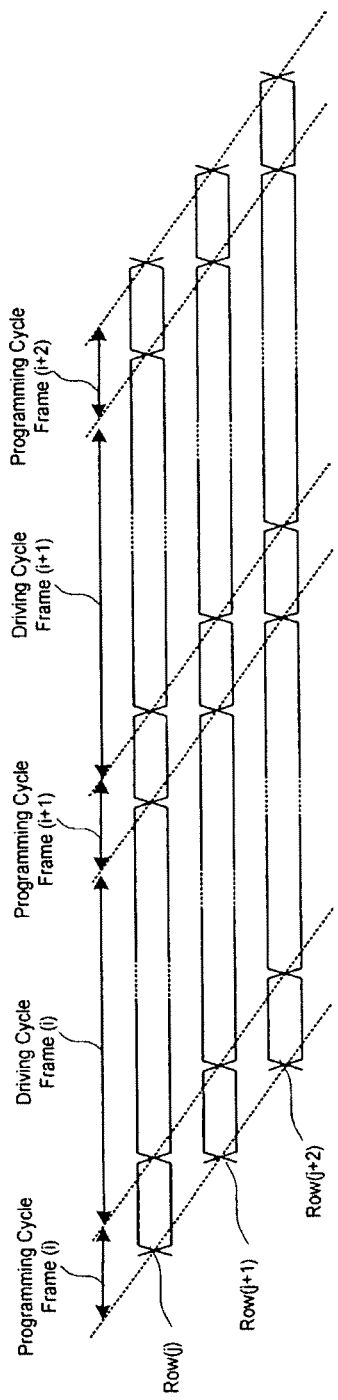
FIG. 12 is a timing diagram showing an example of programming and driving cycles applied to the array of FIGS. 4 and 7.
Figure 13:
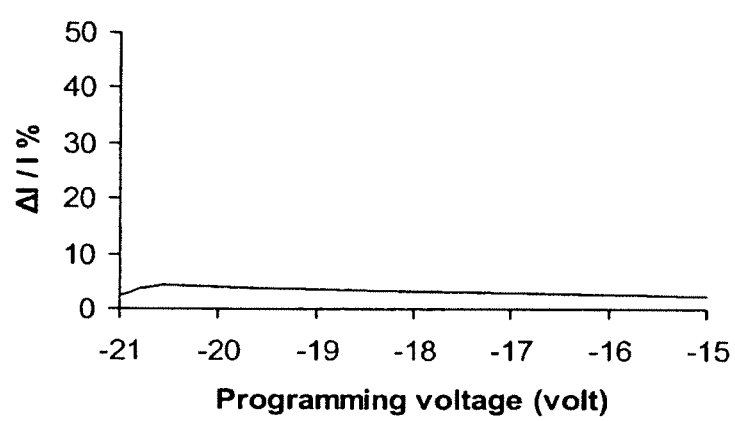
FIG. 13 is a diagram showing simulation result for the driving technique applied to FIGS. 2 and 3.

FIG. 12 is a diagram showing programming and driving cycles for driving the display arrays of FIGS. 4 and 7. In FIG. 13, each of ROW(j), ROW(j+1), and ROW(j+2) represents a row of the display array. The programming and driving cycles for the frame at a ROW overlap with the programming and driving cycles for the same frame at a next ROW. Each programming and driving cycles are those of FIG. 3, 6, 8 or 10.

FIG. 13 illustrates the simulation result for the circuit and waveform shown in the FIGS. 2 and 3. The result shows that the change in the OLED current due 2-volt threshold-shift in the driving transistor 26 is less than 4%.

According to the embodiments of the present invention, the shift(s) of the characteristic(s) of a pixel element(s) (e.g. the threshold voltage shift of a driving transistor and the degradation of a light emitting device under prolonged display operation) is compensated for by voltage stored in a storage capacitor and applying it to the gate of the driving transistor. Thus, the pixel circuit provides a stable current independent of the threshold voltage shift of the driving transistor and OLED degradation under prolonged display operation, which efficiently improves the display operating lifetime. According to the embodiments of the present invention, the brightness stability of the OLED is enhanced by using circuit compensation.

Because of the circuit simplicity, it ensures higher product yield, lower fabrication cost and higher resolution than conventional pixel circuits. Further the driving technique can be employed in large area display due to its fast settling time.

Further, the programming circuit (transitory) is isolated from the line parasitic capacitance unlike the conventional current programming circuit, it ensures fast programming.

All citations are hereby incorporated by reference.

The present invention has been described with regard to one or more embodiments. However, it will be apparent to persons skilled in the art that a number of variations and modifications can be made without departing from the scope of the invention as defined in the claims. Therefore, the invention as defined in the claims, must be accorded the broadest possible interpretation so as to encompass all such modifications and equivalent structures and functions.

What is claimed is:

1. A method of driving a pixel circuit, the pixel circuit comprising a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit having a programming transistor, the programming transistor being connected to the first electrode of the light emitting device and having a gate terminal directly connected to a data line; the method comprising the steps of:
at a programming cycle of the pixel circuit, turning the programming transistor on;
after the programming cycle, turning the programming transistor off for the remainder of a frame time comprising the programming cycle followed by a driving cycle during the frame time.

2. The method of claim 1, wherein during the driving cycle, a voltage at a second node between the first electrode of the light emitting device and a first terminal of the driving transistor goes to a voltage across the light emitting device.

3. The method of claim 2, wherein during the driving cycle, a voltage at a first node defined between the first terminal of the first switch transistor, the gate terminal of the driving transistor, and the first terminal of the first capacitor goes to a voltage that is a function of an aspect ratio of the driving transistor, an aspect ratio of the programming transistor, a programming voltage applied during the programming cycle, the voltage across the light emitting device at the second node, and a shift in a threshold voltage of the driving transistor.

4. The method of claim 1, wherein during the driving cycle following the programming cycle, any shift in a threshold voltage of the programming transistor that occurred during the programming cycle is negligible.

5. The method of claim 1, wherein the programming transistor is on for a small fraction of time during the programming cycle relative to the frame time such that any shift in a threshold voltage of the programming transistor is negligible.

6. The method of claim 1, wherein a first terminal of the programming transistor is connected to the second terminal of the first capacitor and to the first electrode of the light emitting device, and a second terminal of the programming transistor is connected to a controllable voltage line that controls a biasing condition of the programming transistor.

7. The method of claim 6, wherein a negative voltage is applied to the second terminal of the programming transistor during the programming cycle.

8. The method of claim 1, wherein the light emitting device includes an organic light emitting diode (OLED), and the first switch, driving, and programming transistors are n-type and/or p-type thin-film transistors.

9. The method of claim 1, wherein the programming circuit includes a second switch transistor and a second capacitor, the second switch transistor having a gate terminal, a first terminal and a second terminal, the second capacitor having a first terminal and a second terminal, the gate terminal of the programming transistor being connected to the first terminal of the second switch transistor and the first terminal of the second capacitor.

10. The method of claim 1, wherein, during the programming cycle of an nth row, a predetermined voltage is provided to the second terminal of the programming transistor while, during the programming cycle of the (n+1)th row, an address signal of an (n+1)th row is provided to a first switch transistor of a pixel circuit in the (n+1)th row.

11. The method of claim 1, wherein the light emitting device is an OLED, and wherein the programming transistor is under stress for a small fraction of the frame time and adjusting the pixel current, while the driving transistor drives the OLED.

12. The method of claim 1, wherein the programming transistor is a TFT, and the pixel circuit incorporates a short-term biasing condition in which the programming TFT is stable.

* * * * *